United States Patent
Chun

(10) Patent No.: US 10,777,280 B2
(45) Date of Patent: Sep. 15, 2020

(54) MEMORY SYSTEM AND OPERATING METHOD OF THE SAME

(71) Applicant: SK hynix Inc., Gyeonggi-do (KR)

(72) Inventor: Dong-Yeob Chun, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 17 days.

(21) Appl. No.: 16/114,561

(22) Filed: Aug. 28, 2018

(65) Prior Publication Data
US 2019/0189224 A1    Jun. 20, 2019

(30) Foreign Application Priority Data

Dec. 19, 2017   (KR) .................. 10-2017-0175011

(51) Int. Cl.
| | | |
|---|---|---|
| G11C 16/26 | (2006.01) | |
| G06F 11/10 | (2006.01) | |
| G11C 29/00 | (2006.01) | |
| G11C 16/32 | (2006.01) | |
| G06F 12/02 | (2006.01) | |
| G11C 16/04 | (2006.01) | |

(52) U.S. Cl.
CPC .......... *G11C 16/26* (2013.01); *G06F 11/1044* (2013.01); *G06F 11/1048* (2013.01); *G06F 11/1056* (2013.01); *G11C 29/765* (2013.01); *G06F 12/0246* (2013.01); *G11C 16/0483* (2013.01)

(58) Field of Classification Search
CPC ... G11C 16/26; G11C 29/765; G11C 16/0483; G06F 11/1044; G06F 11/1048; G06F 11/1056; G06F 12/0246
See application file for complete search history.

(56) References Cited

U.S. PATENT DOCUMENTS

| | | | | | |
|---|---|---|---|---|---|
| 4,884,271 A | * | 11/1989 | Concha | ............... | G06F 11/1056 714/764 |
| 5,369,651 A | * | 11/1994 | Marisetty | ............ | G06F 11/1056 711/113 |
| 5,452,429 A | * | 9/1995 | Fuoco | ................ | G06F 11/1056 711/105 |
| 5,687,353 A | * | 11/1997 | Chen | .................. | G06F 11/1056 711/155 |

(Continued)

FOREIGN PATENT DOCUMENTS

KR    1020160150478    12/2016

OTHER PUBLICATIONS

Mao et al., Low cost ECC schemes for improving the reliability of DRAM+PRAMMAIN memory systems, IEEE, Conference paper, Pertinent pp. 1-6 (Year: 2014).*

*Primary Examiner* — April Y Blair
*Assistant Examiner* — Dipakkumar B Gandhi
(74) *Attorney, Agent, or Firm* — IP & T Group LLP

(57) ABSTRACT

A memory system includes: a memory device including a plurality of pages; and a controller suitable for generating a read descriptor in response to an entered command, reading and outputting read data stored in at least one page in response to the read descriptor, determining whether each per-page data of the read data includes an error, storing indicators for showing whether each per-page data includes the error, re-reading some of the read data on per-page basis, based on the indicators, without generating another read descriptor, and updating the indicators based on an error check result after the re-reading.

17 Claims, 12 Drawing Sheets

(56) References Cited

U.S. PATENT DOCUMENTS

| | | | | |
|---|---|---|---|---|
| 6,009,547 A | * | 12/1999 | Jaquette | G06F 11/10 710/52 |
| 2006/0291288 A1 | * | 12/2006 | Kang | G11C 16/24 365/185.21 |
| 2008/0195894 A1 | * | 8/2008 | Schreck | G06F 11/106 714/34 |
| 2011/0197015 A1 | * | 8/2011 | Chae | G11C 11/5642 711/103 |

* cited by examiner

MEMORY SYSTEM AND OPERATING METHOD OF THE SAME

CROSS-REFERENCE TO RELATED APPLICATION(S)

The present application claims priority of Korean Patent Application No. 10-2017-0175011, filed on Dec. 19, 2017, which is incorporated herein by reference in its entirety.

BACKGROUND

1. Field

Various exemplary embodiments of the invention generally relate to a memory system. Particularly, the embodiments relate to a memory system capable of processing data with a memory device, and method of operating the memory system.

2. Description of the Related Art

The computer environment paradigm shifts into ubiquitous computing, which can support computing made to appear anytime and anywhere. Consequently, use of portable electronic devices such as mobile phones, digital cameras, and laptop computers has rapidly increased. These portable electronic devices generally use a memory system having one or more memory devices for storing data. The memory system in such devices may be used as a main memory device or an auxiliary memory device.

Memory systems may provide excellent stability, durability, high information access speed, and low power consumption since they have no moving parts (e.g., a mechanical arm with a read/write head) as compared with a hard disk device. Examples of memory systems having such advantages include universal serial bus (USB) memory devices, memory cards having various interfaces, and solid state drives (SSD).

SUMMARY

Various exemplary embodiments of the invention relate to a memory system and, more particularly, to a memory system capable of performing a read retry operation, and an operating method thereof.

Various embodiments of the invention are directed to a memory system capable of improving a read retry operation, and an operating method of the memory system.

In accordance with an embodiment of the present invention, during a read retry operation, memory space and operation time for generating new read descriptor may be reduced by updating existing read descriptor without generating new read descriptor required for the read retry operation.

In accordance with an embodiment of the present invention, an operation of reading a read descriptor is performed only to an initial read descriptor and the operation time may be reduced for the operation of reading a read descriptor. Accordingly, overall overhead of the memory system may be greatly reduced and overall performance of the memory system may be improved.

In accordance with an embodiment of the present invention, an operating method of a memory system, the method includes: performing first read operations to a plurality of pages included in a memory device; generating an error report map including original error report bits according to results of the first read operations; generating a mask map including mask map bits from the error report map including the original error report bits; performing ECC operations to respective pages corresponding to the mask map bits according to bit values of the mask map bits; performing second read operations to the respective pages; and updating the mask map bits according to results of the second read operations, wherein the mask map bits are error report bits, which it is possible to update.

The bit values of the mask map bits may be inverted values of the original error report bits corresponding to the mask map bits.

The operating method may further comprise performing ECC operations to respective pages corresponding to the mask map bits according to the bit values of the updated mask map bits and performing third read operations to the respective pages.

The first read operation may be a multi-read operation, and the second read operation may be a single read operation.

The third read operation may be a single read operation.

In accordance with an embodiment of the present invention, an operating method of a memory system, the method includes: performing first read operations to a plurality of pages included in a memory device; generating a read descriptor including read result information for read units, to which the first read operations are performed; generating, in the read descriptor, an error report map including original error report bits according to results of the first read operations; generating, in the read descriptor, a mask map including mask map bits from the error report map including the original error report bits; and performing ECC operations to respective pages corresponding to the mask map bits according to bit values of the mask map bits, performing second read operations to the respective pages, and updating the mask map bits according to results of the second read operations, wherein the mask map bits are error report bits, which it is possible to update.

The bit values of the mask map bits may be inverted values of the original error report bits corresponding to the mask map bits.

The operating method may further comprise performing ECC operations to respective pages corresponding to the mask map bits according to the bit values of the updated mask map bits and performing third read operations to the respective pages.

The first read operation may be a multi-read operation, and the second read operation may be a single read operation.

The third read operation may be a single read operation.

In accordance with an embodiment of the present invention, a memory system includes: a memory device including a plurality of pages; and a controller, wherein the controller is suitable for: performing first read operations to the plurality of pages included in the memory device; generating a read descriptor including read result information for read units, to which the first read operations are performed; generating, in the read descriptor, an error report map including original error report bits according to results of the first read operations; generating, in the read descriptor, a mask map including mask map bits from the error report map including the original error report bits; performing ECC operations to respective pages corresponding to the mask map bits according to bit values of the mask map bits; performing second read operations to the respective pages; and updating the mask map bits according to results of the second read operations, wherein the mask map bits are error report bits, which it is possible to update.

The bit values of the mask map bits may be inverted values of the original error report bits corresponding to the mask map bits.

The controller may be further suitable for performing ECC operations to respective pages corresponding to the mask map bits according to the bit values of the updated mask map bits and performing third read operations to the respective pages.

The first read operation may be a multi-read operation, and the second read operation may be a single read operation.

The third read operation may be a single read operation.

In accordance with an embodiment of the present invention, an operating method of a memory system, the method includes: performing first read operations to a plurality of pages included in a memory device; generating an error report map including original error report bits according to results of the first read operations; generating a mask map including a first mask map bit and a second mask map bit from the error report map including the original error report bits; and repeating ECC operations to respective pages corresponding to the first mask map bit according to a bit value of the first mask map bit and second read operations to the respective pages, and updating the mask map bits according to results of the second read operations, wherein the ECC operation and the second read operation are terminated when the updated mask map includes only the second mask map bit, and wherein the mask map bits are error report bits, which it is possible to update.

The bit values of the mask map bits may be inverted values of the original error report bits corresponding to the mask map bits.

The first read operation may be a multi-read operation, and the second read operation may be a single read operation.

In accordance with an embodiment of the present invention, an operating method of a memory system, the method includes: performing first read operations to a plurality of pages included in a memory device; generating a read descriptor including read result information for read units, to which the first read operations are performed; generating, in the read descriptor, an error report map including original error report bits according to results of the first read operations; generating, in the read descriptor, a mask map including a first mask map bit and a second map bit from the error report map including the original error report bits; and repeating ECC operations to respective pages corresponding to the first mask map bit according to a bit value of the first mask map bit and second read operations to the respective pages, and updating the mask map bits according to results of the second read operations, wherein the ECC operation and the second read operation are terminated when the updated mask map includes only the second mask map bit, and wherein the mask map bits are error report bits, which it is possible to update.

The bit values of the mask map bits may be inverted values of the original error report bits corresponding to the mask map bits.

The first read operation may be a multi-read operation, and the second read operation may be a single read operation.

In accordance with an embodiment of the present invention, an operating method of a memory system, the method includes: performing first read operations to a plurality of pages included in a memory device; generating a read descriptor including read result information for read units, to which the first read operations are performed; generating, in the read descriptor, an error report map including original error report bits according to results of the first read operations; generating, in the read descriptor, a mask map including a first mask map bit and a second map bit from the error report map including the original error report bits; and repeating ECC operations to respective pages corresponding to the first mask map bit according to a bit value of the first mask map bit and second read operations to the respective pages, and updating the mask map bits according to results of the second read operations, wherein the ECC operation and the second read operation are terminated when the updated mask map includes only the second mask map bit, and wherein the mask map bits are error report bits, which it is possible to update.

The bit values of the mask map bits may be inverted values of the original error report bits corresponding to the mask map bits.

The first read operation may be a multi-read operation, and the second read operation may be a single read operation.

In accordance with an embodiment of the present invention, a memory system includes: a memory device including a plurality of pages; and a controller suitable for generating a read descriptor in response to an entered command, reading and outputting read data stored in at least one page in response to the read descriptor, determining whether each per-page data of the read data includes an error, storing indicators for showing whether each per-page data includes the error, re-reading some of the read data on per-page basis, based on the indicators, without generating another read descriptor, and updating the indicators based on an error check result after the re-reading.

In accordance with an embodiment of the present invention, a memory system includes: a memory device; and a controller including a processor suitable for performing first read operations to a plurality of pages included in a memory device, a memory suitable for storing an error report map and a mask map, and ECC unit suitable for performing ECC operations.

The processor may generate the error report map including original error report bits according to results of the first read operations, and generate the mask map including mask map bits from the error report map including the original error report bits.

The ECC unit may perform ECC operations to respective pages corresponding to the mask map bits according to bit values of the mask map bits.

The processor may perform second read operations to the respective pages, and updates the mask map bits according to results of the second read operations.

The mask map bits may be error report bits, which it is possible to update.

The bit values of the mask map bits may be inverted values of the original error report bits corresponding to the mask map bits.

The ECC unit may further perform ECC operations to respective pages corresponding to the mask map bits according to the bit values of the updated mask map bits and performing third read operations to the respective pages.

The first read operation may be a multi-read operation, and the second read operation may be a single read operation.

The third read operation may be a single read operation.

The processor further may generate a read descriptor including read result information for read units, to which the first read operations are performed, and the error report map may be generated in the read descriptor, and the mask map may be generated in the read descriptor.

The bit values of the mask map bits may be inverted values of the original error report bits corresponding to the mask map bits.

The ECC unit may further perform ECC operations to respective pages corresponding to the mask map bits according to the bit values of the updated mask map bits and performing third read operations to the respective pages.

The first read operation may be a multi-read operation, and the second read operation may be a single read operation.

The third read operation may be a single read operation.

In accordance with an embodiment of the present invention, a memory system includes: a memory device; and a controller including a processor suitable for performing first read operations to a plurality of pages included in a memory device, a memory suitable for storing an error report map and a mask map, and ECC unit suitable for performing ECC operations.

The processor may generate the error report map including original error report bits according to results of the first read operations, and generates the mask map including a first mask map bit and a second mask map bit from the error report map including the original error report bits.

The ECC unit may repeat ECC operations to respective pages corresponding to the first mask map bit according to a bit value of the first mask map bit and second read operations to the respective pages, and updating the mask map bits according to results of the second read operations.

The ECC operation and the second read operation may be terminated when the updated mask map includes only the second mask map bit.

The mask map bits may be error report bits, which it is possible to update.

The bit values of the mask map bits may be inverted values of the original error report bits corresponding to the mask map bits.

The first read operation may be a multi-read operation, and the second read operation may be a single read operation.

The processor may further generate a read descriptor including read result information for read units, to which the first read operations are performed.

The error report map may be generated in the read descriptor, and the mask map may be generated in the read descriptor.

The bit values of the mask map bits may be inverted values of the original error report bits corresponding to the mask map bits.

The first read operation may be a multi-read operation, and the second read operation may be a single read operation.

DETAILED DESCRIPTION

Figure 1:
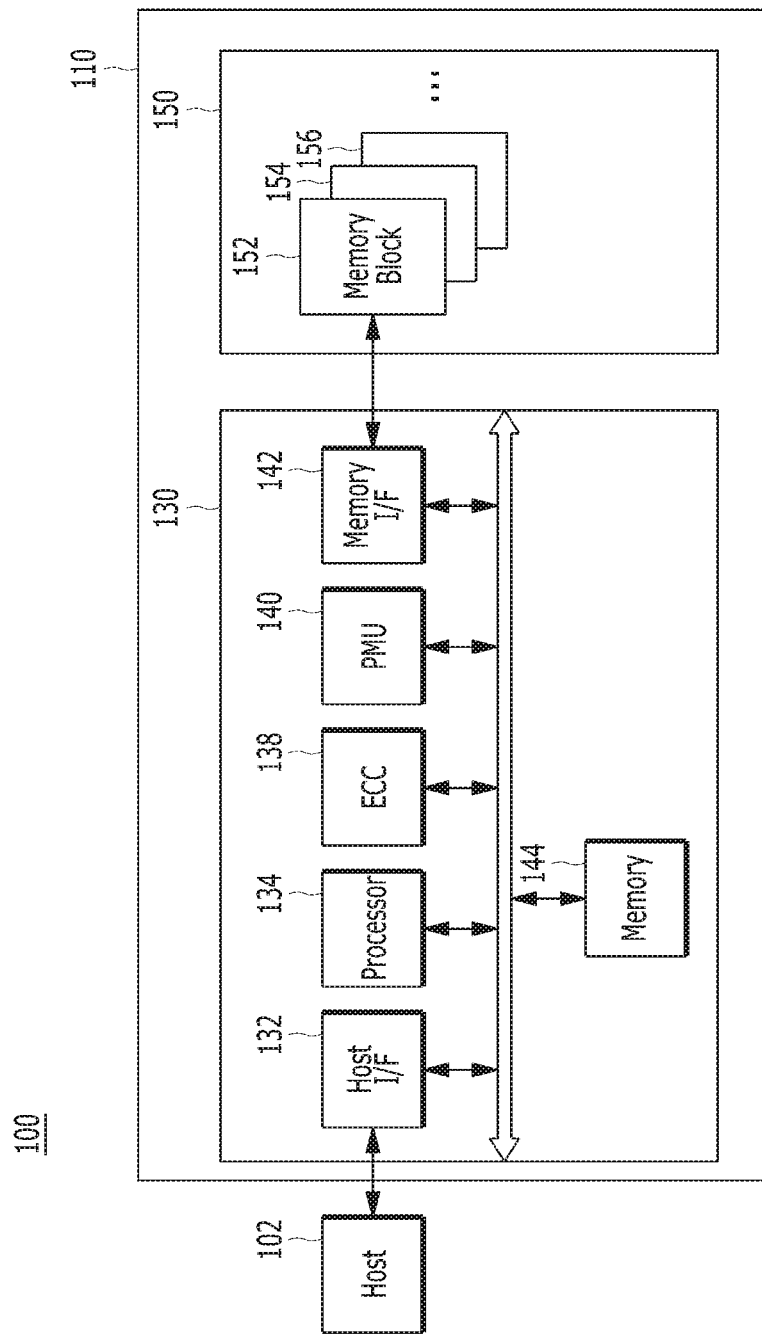
FIG. 1 is a block diagram illustrating a data processing system in accordance with an embodiment of the invention.

Various embodiments of the invention are described below in more detail with reference to the accompanying drawings. We note, however, that the invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated to clearly illustrate various features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for describing specific embodiments only and is not intended to be limiting of the present invention. As used herein, singular forms are intended to include the plural forms as well, unless the context clearly indicates otherwise. It will be further understood that the terms "comprises," "comprising," "includes," and "including" when used in this specification, specify the presence of the stated elements and do not preclude the presence or addition of one or more other elements. As used herein, the term "and/or" includes any or all combinations of one or more of the associated listed items.

Unless otherwise defined, all terms including technical and scientific terms used herein have the same meaning as commonly understood by one of ordinary skill in the art to which the invention belongs in view of the disclosure. It will be further understood that terms, such as those defined in commonly used dictionaries, should be interpreted as having a meaning that is consistent with their meaning in the context of the disclosure and the relevant art and will not be interpreted in an idealized or overly formal sense unless expressly so defined herein.

In the following description, numerous specific details are set forth in order to provide a thorough understanding of the present invention. The invention may be practiced without some or all these specific details. In other instances, well-known process structures and/or processes have not been described in detail in order not to unnecessarily obscure the invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the invention will be described in detail with reference to the attached drawings.

FIG. 1 is a block diagram illustrating a data processing system 100 in accordance with an embodiment of the invention.

Referring to FIG. 1, the data processing system 100 may include a host 102 engaged with a memory system 110.

By the way of example but not limitation, the host 102 may include portable electronic devices such as a mobile phone, MP3 player and laptop computer or non-portable electronic devices such as a desktop computer, a game machine, a TV and a projector.

The host 102 may include a plurality of OSs. The host 102 may execute an OS to perform an operation corresponding to a user's request on the memory system 110. The OS may manage and control overall functions and operations of the host 102. The OS may support provide an operation between the host 102 and a user, which may be achieved or implemented with the data processing system 100 or the memory system 110.

The memory system 110 may operate to store data for the host 102 in response to a request of the host 102. Non-limited examples of the memory system 110 may include a solid state drive (SSD), a multi-media card (MMC), an embedded MMC (eMMC). The SD card may include a mini-SD card and a micro-SD card.

The memory system 110 may be embodied by various types of storage devices. Non-limited examples of storage devices included in the memory system 110 may include volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM) and a flash memory.

The memory system 110 may include a memory device 150 and a controller 130.

The controller 130 and the memory device 150 may be integrated into a single semiconductor device, which may be included in the various types of memory systems as described above. By the way of example but not limitation, the controller 130 and the memory device 150 may be integrated as a single semiconductor device to constitute an SSD, a PCMCIA (personal computer memory card international association) card, and a SD card including a mini-SD, a micro-SD and a SDHC, an UFS device, or the like.

The memory device 150 may be a nonvolatile memory device which may retain data stored therein even though power is not supplied. The memory device 150 may store data provided from the host 102 through a write operation, while outputting data stored therein to the host 102 through a read operation. The memory device 150 may include a plurality of memory blocks 152 to 156, each of the memory blocks 152 to 156 may include a plurality of pages, and each of the pages may include a plurality of memory cells coupled to a word line. In an embodiment, the memory device 150 may be a flash memory. The flash memory may have a 3-dimensional (3D) stack structure.

The structure of the memory device 150 and the 3D stack structure of the memory device 150 will be described in detail later with reference to FIGS. 2 to 4.

The controller 130 may control the memory device 150 in response to a request from the host 102. By the way of example but not limitation, the controller 130 may provide data read from the memory device 150 to the host 102, and store data provided from the host 102 into the memory device 150. For these operations, the controller 130 may control read, write, program and erase operations of the memory device 150.

The controller 130 may include a host interface (I/F) unit 132, a processor 134, an error correction code (ECC) unit 138, a Power Management Unit (PMU) 140, a memory interface (I/F) unit 142 and a memory 144 all operatively coupled via an internal bus.

The host interface unit 134 may be configured to process a command and data of the host 102. The host interface unit 132 may communicate with the host 102 under one or more of various interface protocols such as universal serial bus (USB), serial advanced technology attachment (SATA) and enhanced small disk interface.

The ECC unit 138 may detect and correct an error contained in the data read from the memory device 150. In other words, the ECC unit 138 may perform an error correction decoding process onto the data read from the memory device 150 through an ECC code used during an ECC encoding process. According to a result of the error correction decoding process, the ECC unit 138 may output a signal, for example, an error correction success or fail signal. When the number of error bits is more than a threshold value of correctable error bits, the ECC unit 138 may not correct the error bits. The ECC unit 138 may output the error correction fail signal.

The ECC unit 138 may perform error correction through a coded modulation such as a Low Density Parity Check (LDPC) code, a Bose-Chaudhri-Hocquenghem (BCH) code, a turbo code, a Reed-Solomon code, convolution code, a Recursive Systematic Code (RSC), a Trellis-Coded Modulation (TCM) and a Block coded modulation (BCM). However, the ECC unit 138 is not limited thereto. The ECC unit 138 may include other relevant circuits, modules, systems or devices for use in error correction.

The PMU 140 may manage an electrical power used and provided in the controller 130.

The memory interface unit 142 may work as a memory/storage interface for providing an interface between the controller 130 and the memory device 150 such that the controller 130 controls the memory device 150 in response to a request from the host 102.

The memory 144 may serve as a working memory of the memory system 110 and the controller 130. The memory 144 may store data for driving the memory system 110 and the controller 130.

The memory 144 may store write data and read data required to perform a write operation and a read operation to the memory device 150 in response to a write request and a read request entered from the host 102. The memory 144 may include a buffer and/or a cache for a write operation and a read operation.

The processor 134 may control the overall operations of the memory system 110. The processor 134 may use a firmware to control the overall operations of the memory system 110. The firmware may be referred to as flash translation layer (FTL). Also, the processor 134 may be implemented with a microprocessor or a Central Processing Unit (CPU).

By the way of example but not limitation, the controller 130 may control the memory device 150 to perform a foreground operation through the processor 134 in response to a request entered from the host 102. Or, the controller 130 may handle a background operation of the memory device 150 autonomously without a request entered from the host 102. Also, the background operation may include a garbage collection (GC) operation, a wear-leveling (WL) operation, a map flush operation and a bad block management operation.

Hereafter, the memory device of the memory system in accordance with the embodiment of the invention is described in detail with reference to FIGS. 2 to 4.

Figure 2:
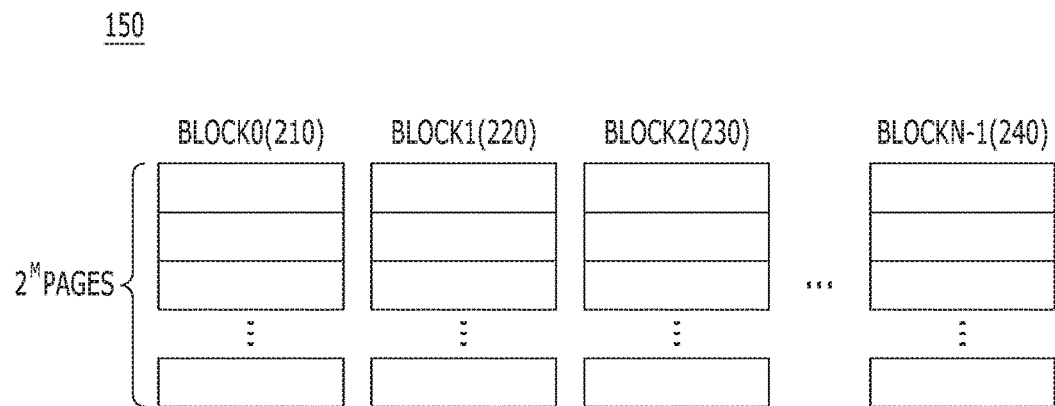
FIG. 2 is a schematic diagram illustrating an exemplary configuration of a memory device employed in a memory system of FIG. 1.
Figure 3:
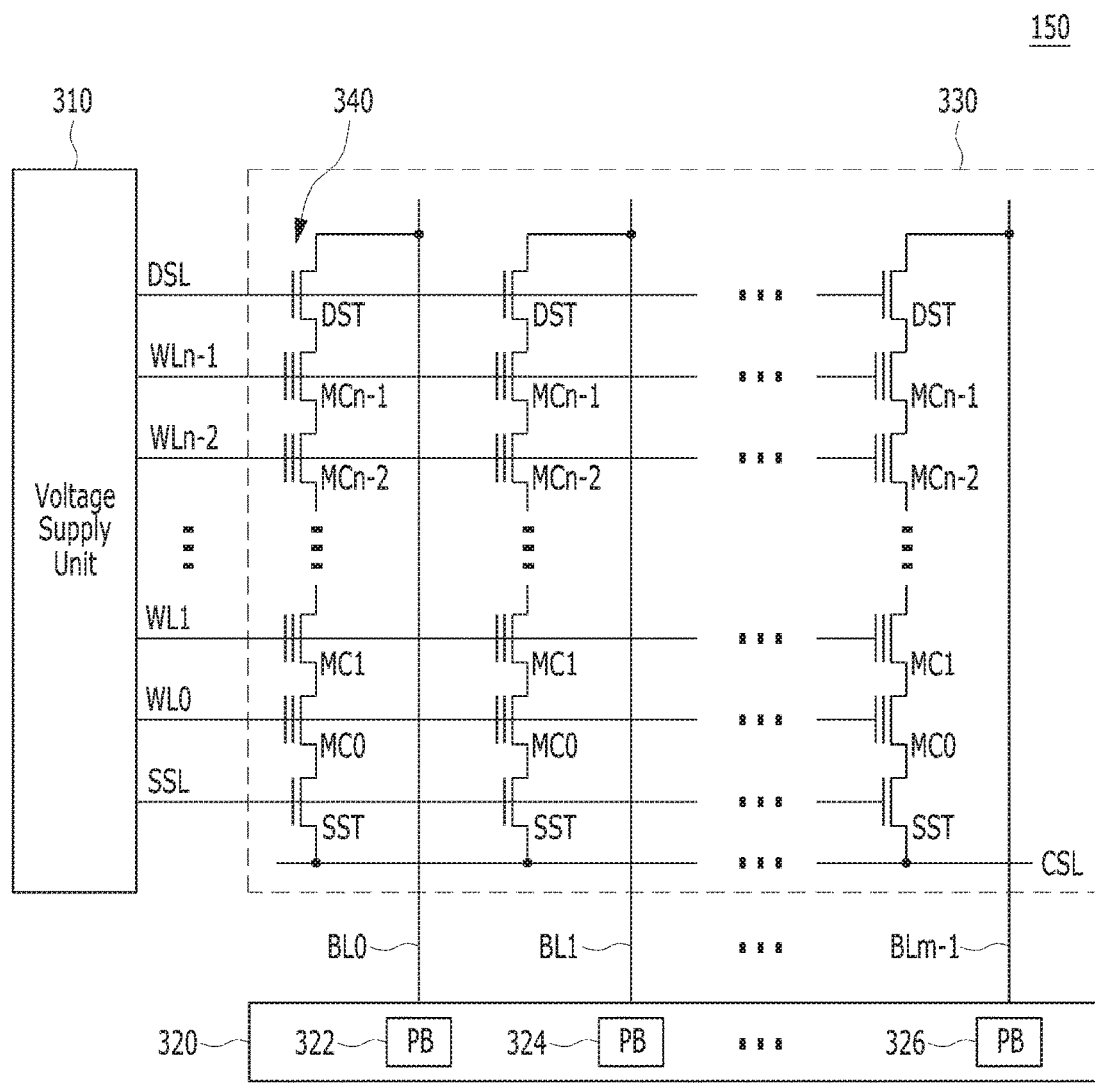
FIG. 3 is a circuit diagram illustrating an exemplary configuration of a memory cell array of a memory block in a memory device shown in FIG. 1.
Figure 4:
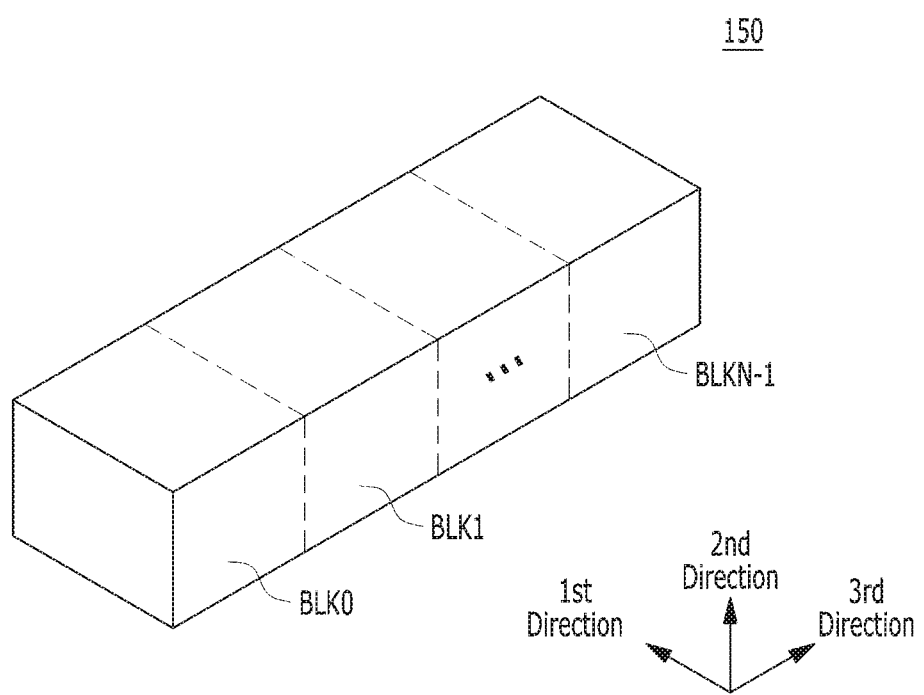
FIG. 4 is a block diagram illustrating a data processing system in accordance with an embodiment of the invention.

FIG. 2 is a schematic diagram illustrating the memory device 150, FIG. 3 is a circuit diagram illustrating an exemplary configuration of a memory cell array of a memory block in the memory device 150 and FIG. 4 is a schematic diagram illustrating an exemplary 3D structure of the memory device 150.

Referring to FIG. 2, the memory device 150 may include a plurality of memory blocks 0 to N−1. Each of the memory blocks BLK0 to BLKN−1 may include a plurality of pages, for example, $2^M$ pages. Here, the number of memory blocks or pages may be different according to circuit design or requirement. Herein, it is described for the sake of convenience in description that each of the memory blocks include $2^M$ pages. However, in another embodiment, each of the memory blocks may include M pages as well. Each of the pages may include a plurality of memory cells that are coupled to a single word line WL or a plurality of word lines WL.

The memory device 150 may include a plurality of memory blocks, as single level cell (SLC) memory blocks and multi-level cell (MLC) memory blocks, according to the number of bits which may be stored or expressed in each memory cell. The SLC memory blocks may include a plurality of pages that are realized by memory cells, each storing one-bit data. On the other hand, the MLC memory blocks may include a plurality of pages that are realized by memory cells, each storing multi-bit data, e.g., data of two or more bits. For example, the memory device 150 may include the MLC memory blocks, each of which includes a plurality of pages that are realized by memory cells, each capable of storing two-bit data. In another example, the memory device 150 may include triple level cell (TLC) memory blocks, each of which includes a plurality of pages that are realized by memory cells, each capable of storing three-bit data. In another example, the memory device 150 may include quadruple level cell (QLC) memory blocks, each of which includes a plurality of pages that are realized by memory cells, each capable of storing four-bit data. In another example, the memory device 150 may include multiple level cell memory blocks each of which includes a plurality of pages that are realized by memory cells, each capable of storing five or more-bit data in one memory cell.

Herein, in accordance with the embodiment of the invention, it is described for the sake of convenience in description that the memory device 150 is a non-volatile memory, such as a flash memory, e.g., a NAND flash memory. However, in another embodiment, the memory device 150 may be realized as one memory among a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-MRAM).

The memory blocks BLK0 to BLKN−1 may store the data entered from the host 102 through a program operation. The memory blocks BLK0 to BLKN−1 may output data stored therein to the host 102 through a read operation.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST, SST, a plurality of memory cells MC0 to MCn−1 may be coupled in series. In an embodiment, each of the memory cell transistors MC0 to MCn−1 may be embodied by an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Although FIG. 3 illustrates NAND flash memory cells, the invention is not limited in this way. It is noted that the memory cells may be NOR flash memory cells, or hybrid flash memory cells including two or more types of memory cells combined therein.

The memory device 150 may further include a voltage supply unit 310 which generate different word line voltages including a program voltage, a read voltage and a pass voltage to supply one of them to respective word lines according to an operation mode. The voltage generation operation of the voltage supply unit 310 may be controlled by a control circuit (not illustrated). Under the control of the control circuit, the voltage supply unit 310 may select at least one of the memory blocks (or sectors) of the memory cell array, select at least one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading (sensing and amplifying) data from the memory cell array. During a program operation, the read/write circuit 320 may work as a write driver for supplying a voltage or a current into bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs), and each of the page buffers 322 to 326 may include a plurality of latches (not illustrated).

The memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1. Herein, FIG. 4 is a block diagram illustrating the memory blocks 152 to 156 of the memory device 150 shown in FIG. 1. Each of the memory blocks 152 to 156 may be realized in a 3D structure (or vertical structure). For example, the memory blocks 152 to 156 may include structures of a three-dimensional structure that are extended in first to third directions, e.g., an x-axis direction, a y-axis direction, and a z-axis direction.

Each memory block 330 included in the memory device 150 may include a plurality of NAND strings NS that are extended in the second direction, and a plurality of NAND strings NS that are extended in the first direction and the third direction. Herein, each of the NAND strings NS may be coupled to a bit line BL, at least one string selection line SSL, at least one ground selection line GSL, a plurality of word lines WL, at least one dummy word line DWL, and a common source line CSL. Each of the NAND strings NS may include a plurality of transistor structures TS.

Each memory block 330 among the memory blocks 152 to 156 of the memory device 150 may be coupled to a plurality of bit lines BL, a plurality of string selection lines SSL, a plurality of ground selection lines GSL, a plurality of word lines WL, a plurality of dummy word lines DWL, and a plurality of common source lines CSL. Each memory block 330 may include a plurality of NAND strings NS. Also, in each memory block 330, a single bit line BL may be coupled to a plurality of NAND strings NS, each including a plurality of transistors. Also, a string selection transistor SST of each NAND string NS may be coupled to a corresponding bit line BL. A ground selection transistor GST of each NAND string NS may be coupled to a common source line CSL. Herein, memory cells MC may be provided between the string selection transistor SST and the ground selection transistor GST of each NAND string NS. In other words, a plurality of memory cells may be included in each memory block 330 of the memory blocks 152 to 156 of the memory device 150.

Hereafter, described with reference to FIGS. 5A to 6B will be a read retry operation in accordance with an embodiment of the invention.

Figure 5A:
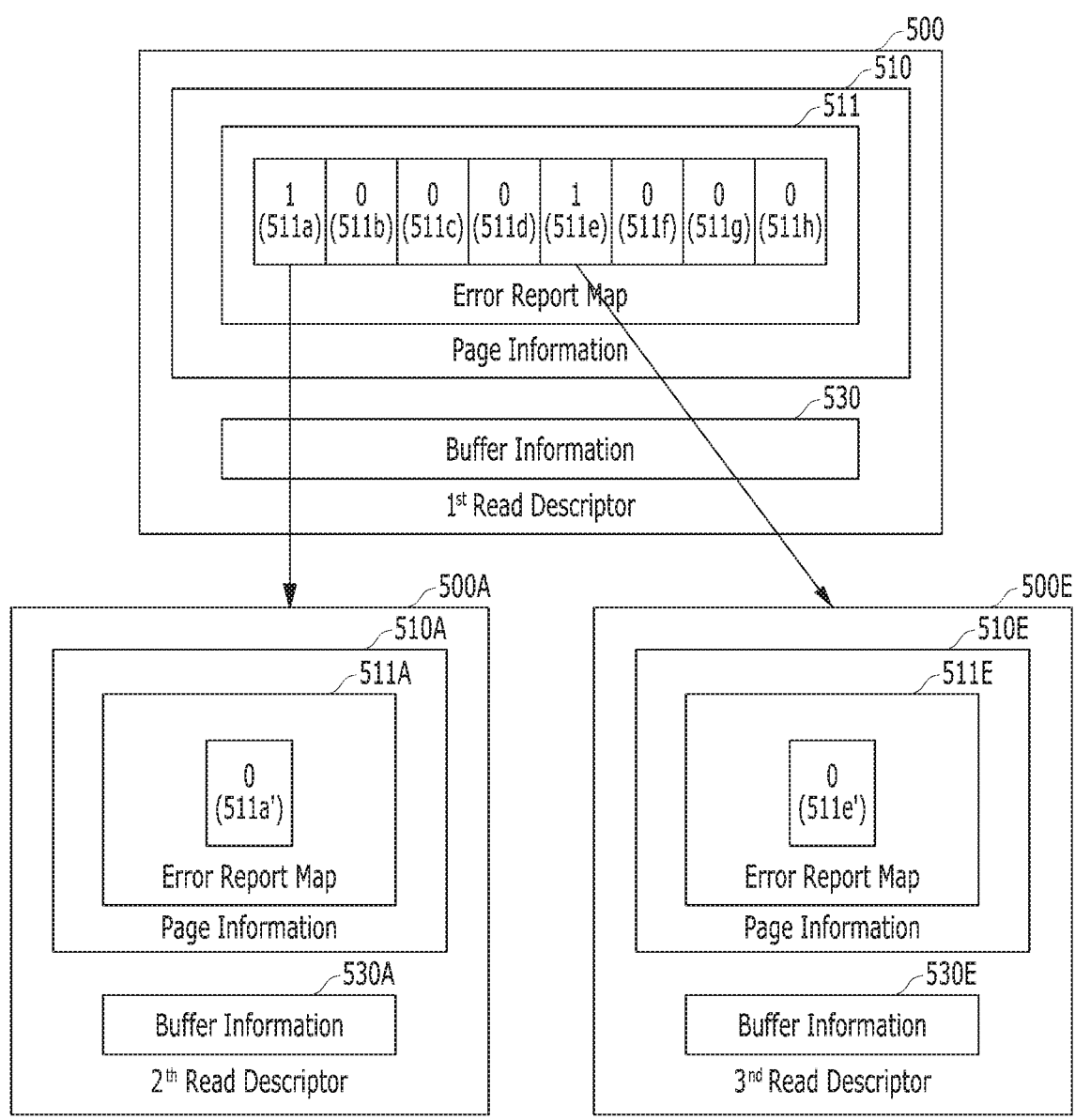
FIGS. 5A and 5B are diagrams schematically illustrating a structure of a read descriptor and a read retry operation using the read descriptor in a conventional memory system.
Figure 5B:
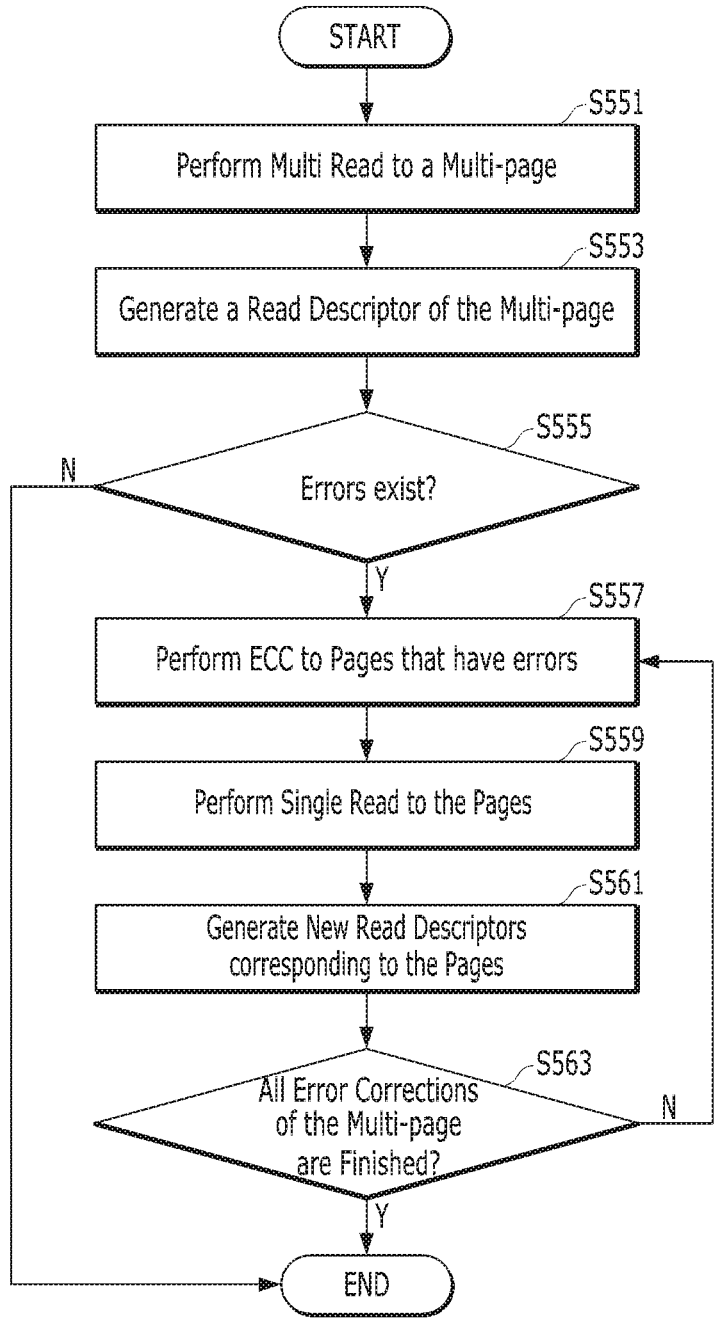

FIGS. 5A and 5B are diagram illustrating a read retry operation of a conventional memory system.

The controller 130 controls the memory device 150 to perform a read operation to a memory block including a plurality of pages. During a read operation of the memory device 150, an error may occur in data read from the memory block.

The controller 130 controls the memory device 150 to perform a read retry operation to a read unit including the data, in which an error occurs.

For example, the controller 130 controls the memory device 150 to perform a first read operation. During the first read operation, an error may occur in data read from the memory device 150. The error-including data is ECC-corrected. Then, the controller 130 controls the memory device 150 to perform a second read operation for the ECC-corrected data. In this description, a read retry operation is defined as the second read operation for the ECC-corrected data after the ECC operation to the error-including data when an error occurs in data read from the memory device 150 during the first read operation.

The read unit may be one of a single page, a plurality of pages, a single memory block and a plurality of memory blocks. For example, when a read operation is a single read operation, the read unit may be a single page (i.e., the read operation is performed on a per-page basis). For example, when a read operation is a multi-read operation (e.g., plural read operations parallelly performed), the read unit may be a plurality of pages.

Hereinafter, described will be a read retry operation under the situation of a multi-read operation performed to a plurality of pages in accordance with various embodiment of the invention. However, in accordance with various embodiment of the invention, the read retry operation may also be applied under the situation of a single read operation.

When an error occurs in data read from a part of the plurality of pages during a multi-read operation, the controller 130 generates a first read descriptor 500 for the multi-read operation.

The first read descriptor 500 includes page information 510 and buffer information 530.

The page information 510 includes information of pages, to which a multi-read operation is performed. The page information 510 includes an error report map 511.

The buffer information 530 includes information of location of a buffer, in which an ECC operation is to be performed to the error-including data.

The first read descriptor 500 may be stored in the memory 144, the memory device 150 or a buffer (not illustrated). Hereinafter, this may be applicable to all read descriptors to be described below.

The error report map 511 has information of a page storing an error-including data when an error occurs in the data during a multi-read operation.

The error report map 511 has a plurality of error report bits 511A to 511H.

The plurality of error report bits 511A to 511H may indicate whether respective pages, to which the multi-read operation is performed, have errors.

An error report bit having a bit value of one (1) indicates that an error occurs in data read from a corresponding page during the multi-read operation. An error report bit having a bit value of zero (0) indicates that no error occurs in data read from a corresponding page during the multi-read operation.

FIG. 5A exemplifies the error report bits 511A, 511E, each having a bit value of one (1) to indicate that an error occurs in data read from a corresponding page during the multi-read operation. Further, each of the error report bits 511B to 511D, 511F to 511H, has a bit value of zero (0) to indicate that no error occurs in data read from a corresponding page during the multi-read operation.

The controller 130 identifies error-including pages storing error-including data through the error report map 511 of the first read descriptor 500, performs an ECC operation to the respective error-including pages, controls the memory device 150 to perform a read retry operation to the respective ECC-performed pages, and generates a new read descriptor according to the read retry operation.

For example, the controller 130 generates a second read descriptor 500A based on the error report bit 511A having a bit value of one (1). The controller 130 generates a third read descriptor 500E based on the error report bit 511E having a bit value of one (1).

The second read descriptor 500A includes page information 510A and buffer information 530A corresponding to the error report bit 511A. The third read descriptor 500E includes page information 510E and buffer information 530E corresponding to the error report bit 511E.

FIG. 5B is a flowchart illustrating an operation of generating the plurality of read descriptors 500A, 500E, which is performed by the controller 130.

At step S551, the controller 130 controls the memory device 150 to perform a multi-read operation to a plurality of pages.

At step S553, the controller 130 generates the first read descriptor 500 according to the multi-read operation.

At step S555, the controller 130 determines whether any error occurs in data read from the plurality of pages. The controller 130 identifies error-including pages storing error-including data through the first read descriptor 500.

At step S557, the controller 130 performs an ECC operation to the error-including pages to error-correct the error-including data stored in the error-including pages.

At step S559, the controller 130 controls the memory device 150 to perform a read retry operation to each of the pages previously storing the error-including data.

At step S561, the controller 130 generates the second read descriptor 500A and the third read descriptor 500E which are respectively corresponding to the pages previously storing the error-including data.

At step S563, the controller 130 determines whether any error occurs in data read from the pages, to each of which the read retry operation is performed. That is, the controller 130 detects the completion of the read retry operation. When any error occurs in data read from the pages, to each of which the read retry operation is performed (i.e., when the read retry operation is not yet completed), the controller 130 repeats steps S557 to S563.

As such, according to a prior art, the controller 130 generates during a read retry operation the new second read descriptor 500A and third read descriptor 500E which are respectively corresponding to the error-including pages storing the error-including data. In order that the second read descriptor 500A and the third read descriptor 500E are generated, a step of generating the page information 510A and 510E and the buffer information 530A and 530E respectively may be inevitable. An additional storage may be required for generating and storing of the second read descriptor 500A and the third read descriptor 500E. Time is required to generate the page information 510A and 510E and the buffer information 530A and 530E.

Figure 6A:
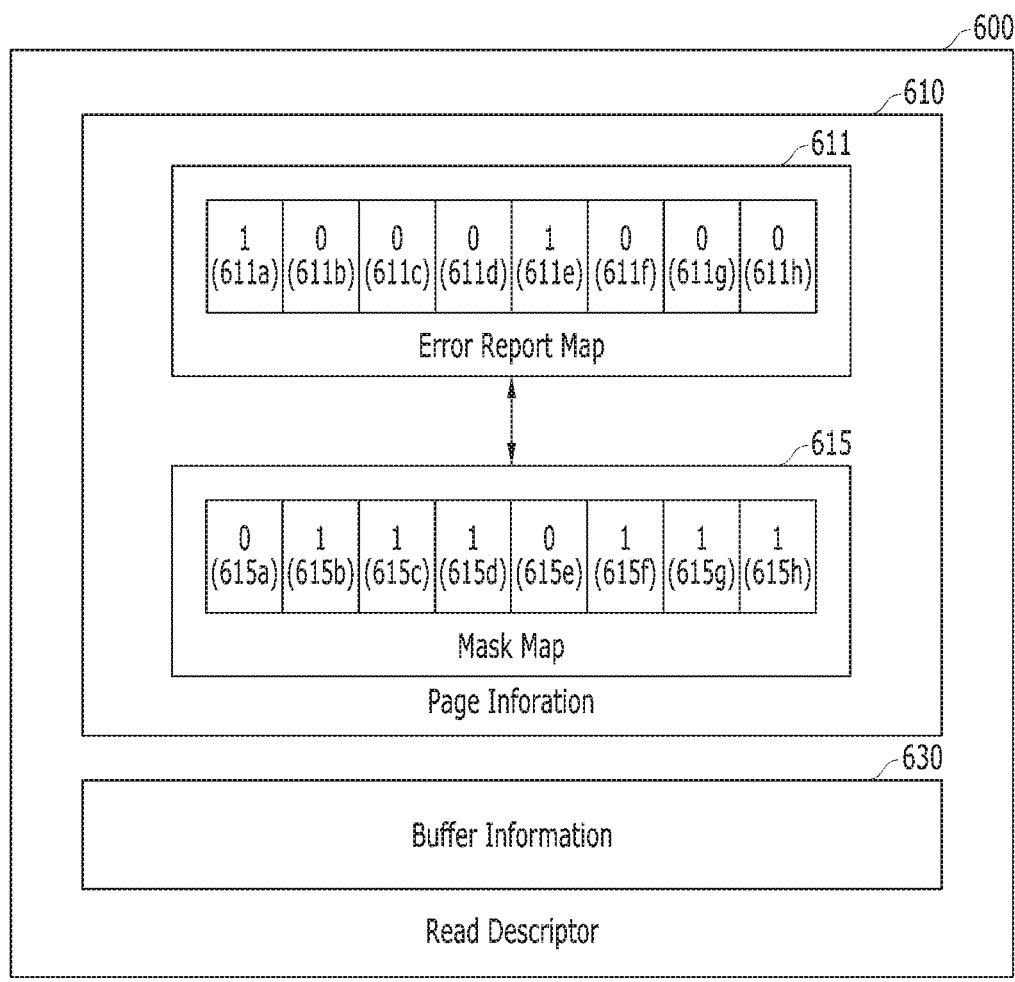
FIGS. 6A and 6B are diagrams schematically illustrating a structure of a read descriptor and a read retry operation using the read descriptor in accordance with an embodiment of the invention.
Figure 6B:
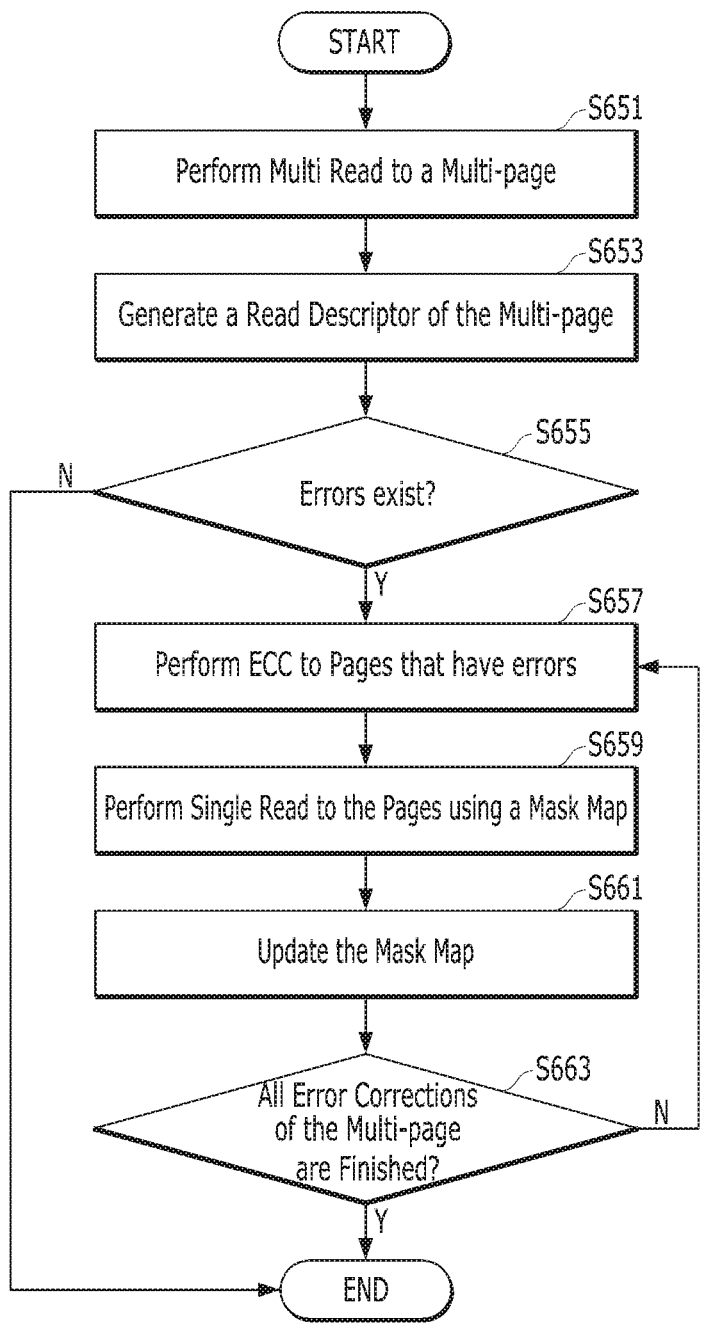

FIGS. 6A and 6B are diagram schematically illustrating a structure of a read descriptor 600 and a read retry operation using the read descriptor 600 in accordance with an embodiment of the invention.

The read descriptor 600 may include page information 610 and buffer information 630. The page information 610 may include information of pages, to which a multi-read operation is performed, and may include an error report map 611 and a mask map 615. The buffer information 630 may include information of location of a buffer, in which an ECC operation is to be performed to the error-including data.

The error report map 611 may have information of a page storing an error-including data when an error occurs in the data during a multi-read operation. The error report map 611 may have a plurality of original error report bits 611A to 611H.

The plurality of error report bits 611A to 611H may indicate whether respective pages, to which the multi-read operation is performed, have errors.

An original error report bit having a bit value of one (1) may indicate that an error occurs in data read from a corresponding page during the multi-read operation.

An original error report bit having a bit value of zero (0) may indicate that no error occurs in data read from a corresponding page during the multi-read operation.

FIG. 6A exemplifies the original error report bits 611A and 611E each having a bit value of one (1) to indicate that an error occurs in data read from a corresponding page during the multi-read operation. Further, each of the original error report bits 611B to 611D and 611F to 611H may be have a bit value of zero (0) to indicate that no error occurs in data read from a corresponding page during the multi-read operation.

The mask map 615 may have information for determining whether to perform a read retry operation. The mask map 615 may include a plurality of mask map bits 615A to 615H.

The plurality of mask map bits 615A to 615H may be inversion bits of the plurality of original error report bits 611A to 611H, respectively.

When an original error report bit has a value of one (1), a corresponding mask map bit may have a value of zero (0). When an original error report bit has a value of zero (0), a corresponding mask map bit may have a value of one (1).

A mask map bit having a bit value of zero (0) may indicate that an error occurs in data read from a corresponding page during the multi-read operation. A mask map bit having a bit value of one (1) may indicate that no error occurs in data read from a corresponding page during the multi-read operation.

FIG. 6A exemplifies the mask map bits 615A and 615E each having a bit value of zero (0) to indicate that an error occurs in data read from a corresponding page during the multi-read operation. Each of the mask map bits 615B to 615D and 615F to 615H may have a bit value of one (1) to indicate that no error occurs in data read from a corresponding page during the multi-read operation.

Differently from the plurality of original error report bits 611A to 611H representing information about a first read operation, the plurality of mask map bits 615A to 615H may further represent information about a second read operation or the read retry operation, which is subsequently performed according to the first read operation.

The respective bit values of the plurality of mask map bits 615A to 615H may be updated according to the read retry operation.

The processor 134 of the controller 130 may update and use the plurality of mask map bits 615A to 615H when the processor 134 controls the memory device 150 to perform the first read operation, performs the ECC operation to data read according to the first read operation, and controls the memory device 150 to perform the second read operation or the read retry operation.

According to a prior art, the processor generates a new read descriptor during the second read operation or the read retry operation. In accordance with an embodiment of the invention, without the generation of a new read descriptor during the second read operation or the read retry operation, the processor 134 may control the memory device 150 to perform the second read operation or the read retry operation by updating the mask map 615 of the read descriptor 600 corresponding to the first read operation.

The second read operation may be repeatedly performed according to the plurality of mask map bits 615A to 615H, which are updated. For example, the first mask map bit 615A still having a value of zero (0) among the plurality of mask map bits 615A to 615H of the mask map 615 even after the ECC operation and the subsequent second read operation may indicate that an error still occurs in data read from a corresponding page even after the ECC operation and the subsequent second read operation. Therefore, an ECC operation and a subsequent third read operation (i.e., the repetition of the second read operation) may be performed to the individual page corresponding to the first mask map bit 615A. The second read operation or the third read operation to the individual page may be a single read operation.

In accordance with an embodiment of the invention, units and sizes of the original error report map 611 and the mask map 615 may be variously defined. In this description, the original error report map 611 and the mask map 615 may include an original error report map and a mask map of various units and sizes, respectively.

FIG. 6B is a flowchart illustrating an operation of updating the mask map 615 included in the read descriptor 600, which is performed by the processor 134.

At step S651, the processor 134 may control the memory device 150 to perform a multi-read operation to a plurality of pages. The ECC unit 138 may determine whether any error occurs in data read from the plurality of pages.

At step S653, the processor 134 may generate the read descriptor 600 according to the multi-read operation. As described above, the read descriptor 600 include error report map 611 which have information whether any error occurs in data read from the plurality of pages. The read descriptor 600 include mask map 615 which have information whether to perform a read retry operation. The processor 134 may store the read descriptor 600 in the memory 144.

At step S655, the processor 134 may identify error-including pages storing error-including data through the read descriptor 600.

At step S657, the ECC unit 138 may perform an ECC operation to the error-including pages to error-correct the error-including data stored in the error-including pages.

At step S659, the processor 134 may control the memory device 150 to perform a read retry operation to each of the pages previously storing the error-including data by referring to the mask map 615.

At step S661, the processor 134 may update each of the mask map bits (e.g., the mask map bits 615A and 615E) corresponding to the pages previously storing the error-including data according to a result of the ECC operation of step S657.

At step S663, the processor 134 may determine whether any error occurs in data read from the pages, to each of which the read retry operation is performed. That is, the processor 134 detects the completion of the read retry operation. When any error occurs in data read from the pages, to each of which the read retry operation is performed (i.e., when the read retry operation is not yet completed), the processor 134 repeats steps S657 to S663.

As described above, in accordance with an embodiment of the invention, the controller 130 may update the plurality of mask map bits 615A to 615H of the mask map 615 included in a single read descriptor 600 without generation of new read descriptors for respective pages storing the error-including data.

Accordingly, in accordance with an embodiment of the invention, storage space for the new read descriptors may not be required and operation time for generating the new descriptors may not be required.

Therefore, in accordance with an embodiment of the invention, storage space for the read descriptor may not become greater since any other read descriptor except for an initial read descriptor is not generated.

Further, in accordance with an embodiment of the invention, operation time may be reduced for managing the read descriptor since any other read descriptor except for the initial read descriptor is not managed, which may improve or enhance overall operation performance of the memory system.

Still further, in accordance with an embodiment of the invention, operation time required to perform a read operation since a read operation is not performed to any other read descriptor except for the initial read descriptor, which may reduce an overall overhead of the memory system and thus may improve or enhance overall operation performance of the memory system.

A data processing system and electronic devices to which the memory system 110 including the memory device 150 and the controller 130, which are described above with reference to FIGS. 1 to 6B, are described in detail below with reference to FIGS. 7 to 15, in accordance with an embodiment of the invention.

Figure 7:
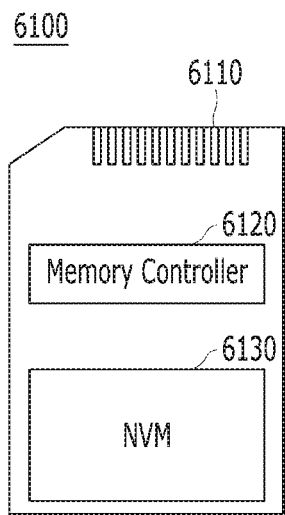
FIGS. 7 to 15 are diagrams schematically illustrating application examples of the data processing system, in accordance with various embodiments of the invention.

FIG. 7 is a diagram schematically illustrating an example of the data processing system including the memory system in accordance with the embodiment. Specifically, FIG. 7 schematically illustrates a memory card system to which the memory system in accordance with the embodiment is applied.

Referring to FIG. 7, the memory card system 6100 may include a memory controller 6120, a memory device 6130 and a connector 6110.

More specifically, the memory controller 6120, configured to access the memory device 6130, may be electrically connected to the memory device 6130, embodied by a nonvolatile memory. For example, the memory controller 6120 may be configured to control read, write, erase and background operations of the memory device 6130. The memory controller 6120 may be configured to provide an interface between the memory device 6130 and a host, and to use a firmware for controlling the memory device 6130. That is, the memory controller 6120 may correspond to the controller 130 of the memory system 110 described with reference to FIG. 1, while the memory device 6130 may correspond to the memory device 150 of the memory system 110 described with reference to FIG. 1.

Thus, the memory controller 6120 may include a RAM, a processing unit, a host interface, a memory interface and an error correction unit.

The memory controller 6120 may communicate with an external device, for example, the host 102 of FIG. 1 through the connector 6110. By the way of example but not limitation, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or specific mobile electronic devices.

The memory device 6130 may be implemented with a nonvolatile memory. By the way of example but not limitation, the memory device 6130 may be implemented with various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC) and a universal flash storage (UFS).

Figure 8:
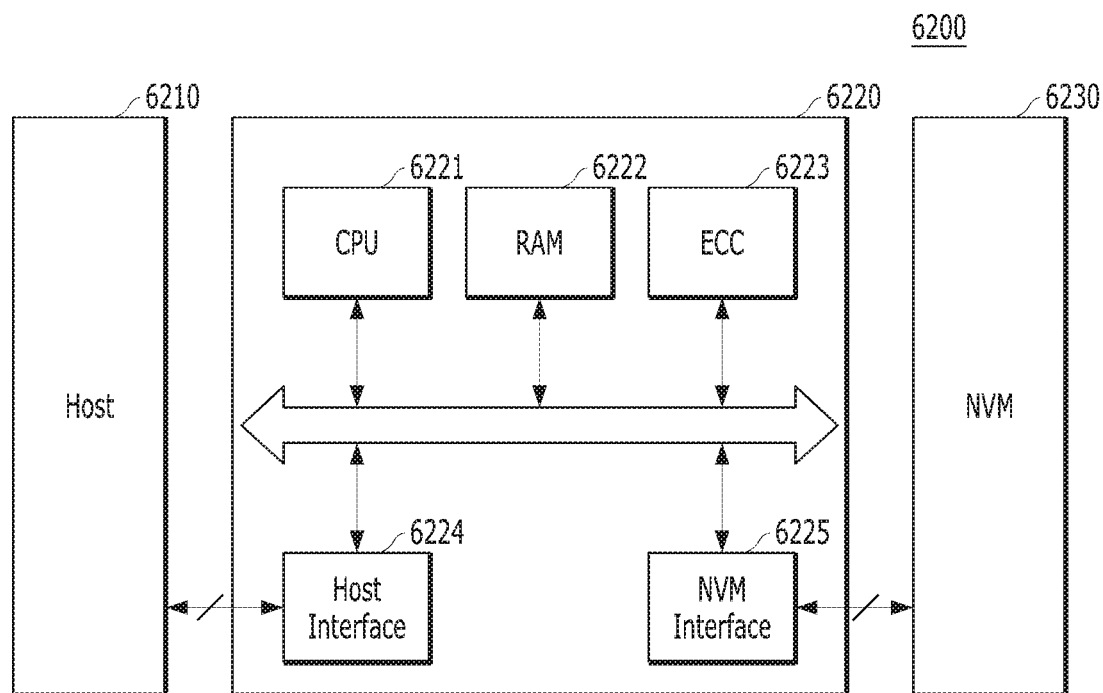

FIG. 8 is a diagram schematically illustrating another example of the data processing system including the memory system in accordance with the present embodiment.

Referring to FIG. 8, the data processing system 6200 may include a memory device 6230 having one or more nonvolatile memories and a memory controller 6220 for controlling the memory device 6230. The data processing system 6200 illustrated in FIG. 8 may serve as a storage medium such as a memory card (a CF, a SD, a micro-SD or the like) or USB device, as described with reference to FIG. 1. The memory device 6230 may correspond to the memory device 150 in the memory system 110 illustrated in FIG. 1. The memory controller 6220 may correspond to the controller 130 in the memory system 110 illustrated in FIG. 1.

The memory controller 6220 may control a read, write or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may correspond to the ECC 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, the BCH code, the turbo code, the Reed-Solomon code, the convolution code, the RSC, the coded modulation such as TCM or BCM, or the like.

The memory controller 6220 may transmit/receive data to/from the host 6210 through the host interface 6224. The memory controller 6220 may transmit/receive data to/from the memory device 6230 through the NVM interface 6225. The host interface 6224 may be connected to the host 6210 via a PATA bus, a SATA bus, a SCSI, a USB, a PCIe or a NAND interface. The memory controller 6220 may carry out a wireless communication function with a mobile communication protocol such as WiFi or Long Term Evolution (LTE). The memory controller 6220 may be connected to an external device, for example, the host 6210 or another external device, and then transmit/receive data to/from the external device. As the memory controller 6220 is configured to communicate with the external device through one or more of various communication protocols, the memory system and the data processing system in accordance with the present embodiment may be applied to wired/wireless electronic devices or particularly a mobile electronic device.

Figure 9:
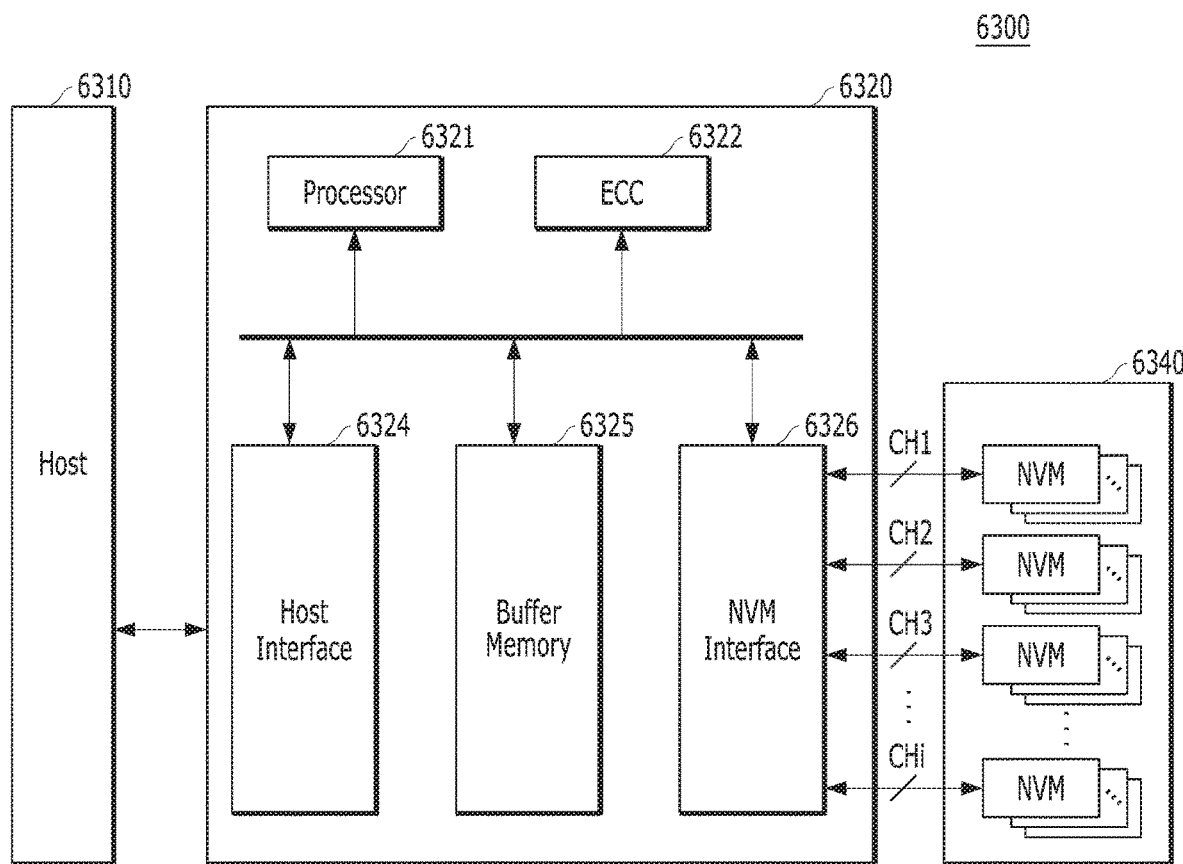

FIG. 9 is a diagram schematically illustrating another example of the data processing system including the memory system in accordance with the present embodiment. Specifically, FIG. 9 schematically illustrates an SSD to which the memory system in accordance with the present embodiment is applied.

Referring to FIG. 9, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340. Further, the buffer memory 6325 may temporarily store meta data of the plurality of flash memories NVM, for example, map data including a mapping table. The buffer memory 6325 may be embodied by volatile memories such as a DRAM, a SDRAM, a DDR SDRAM, a LPDDR SDRAM and a GRAM or nonvolatile memories such as a FRAM, a ReRAM, a STT-MRAM and a PRAM. For convenience of description, FIG. 8 illustrates that the buffer memory 6325 exists in the controller 6320. However, the buffer memory 6325 may be arranged outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, to output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, to output data read from the selected SSDs 6300 to the host 6310.

Figure 10:
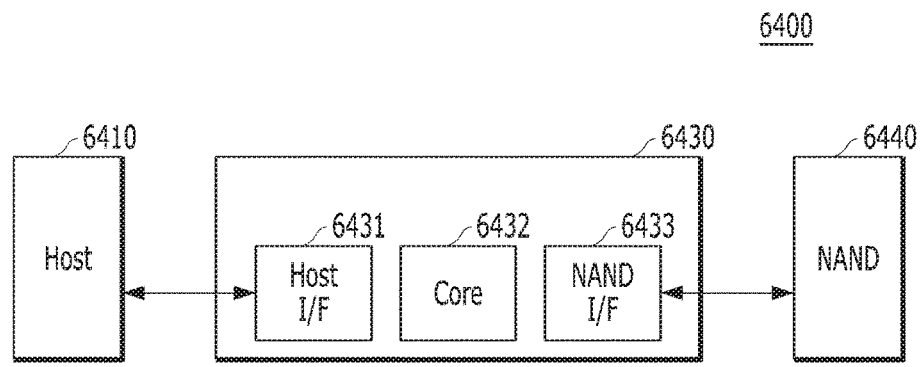

FIG. 10 is a diagram schematically illustrating another example of the data processing system including the memory system in accordance with the present embodiment. Specifically, FIG. 10 schematically illustrates an embedded Multi-Media Card (eMMC) to which the memory system in accordance with the present embodiment is applied.

Referring to FIG. 10, the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410. The NAND interface 6433 may provide an interface function between the memory device 6440 and the controller 6430. By the way of example but not limitation, the host interface 6431 may serve as a parallel interface such as a MMC interface as described with reference to FIG. 1. Furthermore, the host interface 6431 may serve as a serial interface, for example, UHS ((Ultra High Speed)-I/UHS-II) interface.

FIGS. 11 to 14 are diagrams schematically illustrating other examples of the data processing system including the memory system in accordance with the present embodiment. Specifically, FIGS. 10 to 13 schematically illustrate universal flash storage (UFS) systems to which the memory system in accordance with the present embodiment is applied.

Referring to FIGS. 11 to 14, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices including mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices or specific mobile electronic devices under UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700, 6800, the UFS devices 6520, 6620, 6720, 6820 may be embodied in the form of the data processing system 6200, the SSD 6300 or the eMMC 6400 described with reference to FIGS. 8 to 10, and the UFS cards 6530, 6630, 6730, 6830 may be embodied in the form of the memory card system 6100 described with reference to FIG. 7.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other under various protocols other than the UFS protocol, for example, an UFDs, a MMC, a SD, a mini-SD, and a micro-SD.

Figure 11:
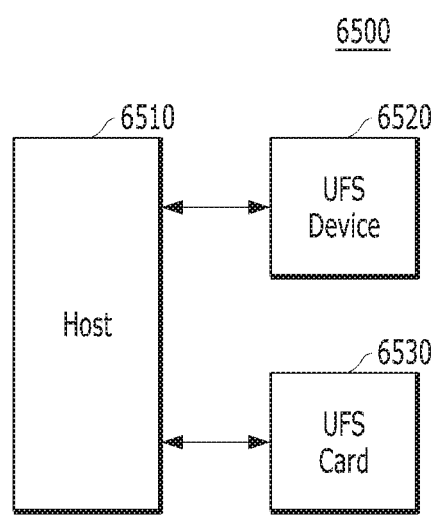

In the UFS system 6500 illustrated in FIG. 11, each of the host 6510, the UFS device 6520 and the UFS card 6530 may include UniPro. The host 6510 may perform a switching operation to communicate with the UFS device 6520 and the UFS card 6530. Particularly, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the embodiment, the configuration in which one UFS device 6520 and one UFS card 6530 are connected to the host 6510 is described by way of example. However, a plurality of UFS devices and UFS cards may be connected in parallel or in the form of a star to the host 6410. Here, the form of a star is a sort of arrangement where a single device is coupled with plural devices for centralized operation. A plurality of UFS cards may be connected in parallel or in the form of a star to the UFS device 6520 or connected in series or in the form of a chain to the UFS device 6520.

Figure 12:
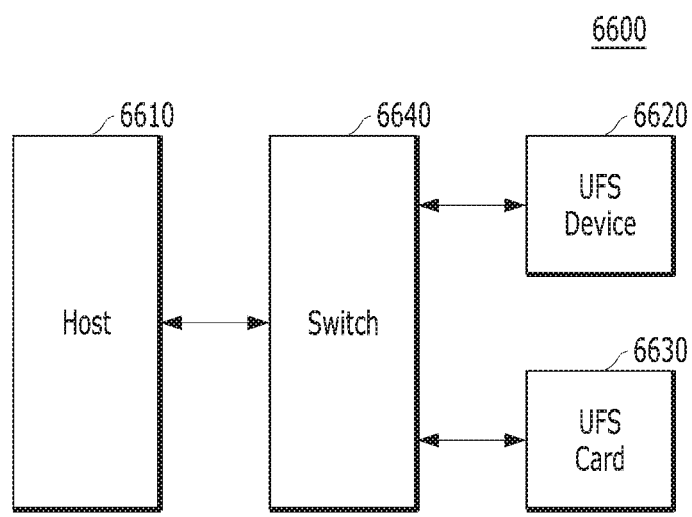

In the UFS system 6600 illustrated in FIG. 12, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the embodiment, the configuration in which one UFS device 6620 and one UFS card 6630 are connected to the switching module 6640 is described by way of example. However, a plurality of UFS devices and UFS cards may be connected in parallel or in the form of a star to the switching module 6640. A plurality of UFS cards may be connected in series or in the form of a chain to the UFS device 6620.

Figure 13:
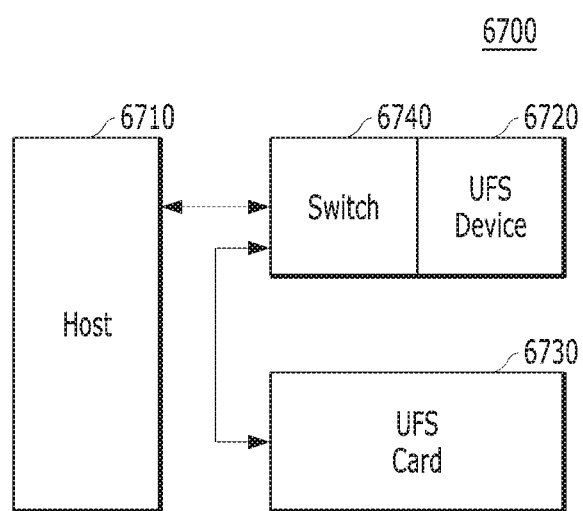

In the UFS system 6700 illustrated in FIG. 13, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720. In the present embodiment, the configuration in which one UFS device 6720 and one UFS card 6730 are connected to the switching module 6740 is described by way of example. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 14:
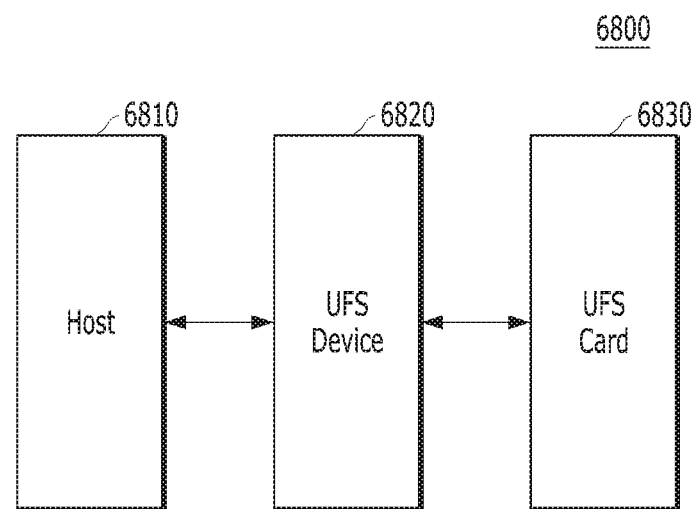

In the UFS system 6800 illustrated in FIG. 14, each of the host 6810, the UFS device 6820 and the UFS card 6830 may include M-PHY and UniPro. The UFS device 6820 may perform a switching operation to communicate with the host 6810 and the UFS card 6830. Particularly, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the embodiment, the configuration in which one UFS device 6820 is connected to the host 6810 and one UFS card 6830 is connected to the UFS device 6820 is described by way of example. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 15:
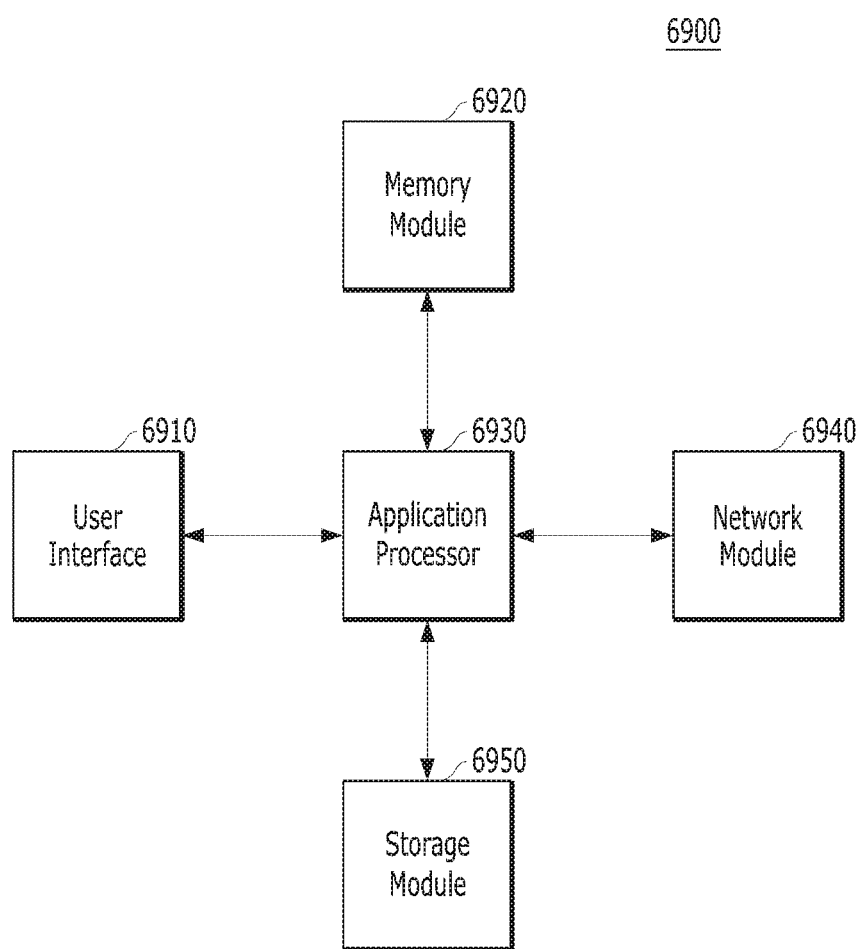

FIG. 15 is a diagram schematically illustrating another example of the data processing system including the memory system in accordance with an embodiment of the invention, and more particularly illustrating a user system to which the memory system in accordance with the embodiment is applied.

Referring to FIG. 15, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as a DRAM, a SDRAM, a DDR SDRAM, a DDR2 SDRAM, a DDR3 SDRAM, a LPDDR SDARM, a LPDDR3 SDRAM or a LPDDR3 SDRAM or a nonvolatile RAM such as a PRAM, a ReRAM, a MRAM or a FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI-DI), thereby communicating with wired/wireless electronic devices including mobile electronic devices. Therefore, the memory system and the data processing system, in accordance with an embodiment of the invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, an eMMC and an UFS as described above with reference to FIGS. 9 to 14.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device. The user interface 6910 may support a function of receiving data from the touch panel.

According to embodiments of the invention, a memory system and an operating method thereof are capable of processing data to a memory device quickly and stably by minimizing the complexity and performance deterioration of the memory system and maximizing the utility efficiency of the memory device.

While the invention has been described with respect to various embodiments, it will be apparent to those skilled in the art from the foregoing description that various changes and modifications may be made without departing from the spirit and scope of the invention as defined in the following claims.

What is claimed is:

1. A memory system comprising:
   a memory device; and
   a controller including a processor suitable for performing first read operations to a plurality of pages included in the memory device, a memory suitable for storing an error report map and a mask map, and ECC unit suitable for performing ECC operations,
   wherein the processor generates the error report map including original error report bits according to results of the first read operations, and generates the mask map including mask map bits from the error report map including the original error report bits, wherein the ECC unit performs ECC operations to respective pages corresponding to the mask map bits according to bit values of the mask map bits, wherein the processor performs second read operations to the respective pages, and updates the mask map bits according to results of the second read operations, and wherein the mask map bits are error report bits, which it is possible to update.

2. The memory system of claim 1, wherein the bit values of the mask map bits are inverted values of the original error report bits corresponding to the mask map bits.

3. The memory system of claim 1, the ECC unit further performs ECC operations to respective pages corresponding to the mask map bits according to the bit values of the updated mask map bits and performing third read operations to the respective pages.

4. The memory system of claim 3, wherein the third read operations are a single read operation.

5. The memory system of claim 1,
wherein the first read operations are a multi-read operation, and
wherein the second read operations are a single read operation.

6. The memory system of claim 1, the processor further generates a read descriptor including read result information for read units, to which the first read operations are performed, and
wherein the error report map is generated in the read descriptor, and
wherein the mask map is generated in the read descriptor.

7. The memory system of claim 6, wherein the bit values of the mask map bits are inverted values of the original error report bits corresponding to the mask map bits.

8. The memory system of claim 6, the ECC unit further performs ECC operations to respective pages corresponding to the mask map bits according to the bit values of the updated mask map bits and performing third read operations to the respective pages.

9. The memory system of claim 8, wherein the third read operations are a single read operation.

10. The memory system of claim 6,
wherein the first read operations are a multi-read operation, and
wherein the second read operations are a single read operation.

11. A memory system comprising:
a memory device; and
a controller including a processor suitable for performing first read operations to a plurality of pages included in the memory device, a memory suitable for storing an error report map and a mask map, and ECC unit suitable for performing ECC operations, wherein the processor generates the error report map including original error report bits according to results of the first read operations, and generates the mask map including a first mask map bit and a second mask map bit from the error report map including the original error report bits, wherein the ECC unit repeats ECC operations to respective pages corresponding to the first mask map bit according to a bit value of the first mask map bit and second read operations to the respective pages, and updating the mask map bits according to results of the second read operations, wherein the ECC operations and the second read operations are terminated when the updated mask map includes only the second mask map bit, and wherein the mask map bits are error report bits, which it is possible to update.

12. The memory system of claim 11, wherein the bit values of the mask map bits are inverted values of the original error report bits corresponding to the mask map bits.

13. The memory system of claim 11,
wherein the first read operations are a multi-read operation, and
wherein the second read operations are a single read operation.

14. The memory system of claim 11, the processor further generates a read descriptor including read result information for read units, to which the first read operations are performed, and
wherein the error report map generated in the read descriptor, and
wherein the mask map generated in the read descriptor.

15. The memory system of claim 14, wherein the bit values of the mask map bits are inverted values of the original error report bits corresponding to the mask map bits.

16. The memory system of claim 14,
wherein the first read operations are a multi-read operation, and
wherein the second read operations are a single read operation.

17. A memory system comprising:
a memory device including a plurality of pages; and
a controller suitable for generating a read descriptor in response to an entered command, reading and outputting read data stored in at least one page in response to the read descriptor, determining whether each per-page data of the read data includes an error, storing indicators for showing whether each per-page data includes the error, re-reading some of the read data on per-page basis, based on the indicators, without generating another read descriptor, and updating the indicators based on an error check result after the re-reading.

* * * * *